United States Patent [19]

Sugita et al.

[11] Patent Number: 4,745,005

[45] Date of Patent: * May 17, 1988

[54] MAGNETIC RECORDING MEDIUM AND METHOD FOR MAKING THE SAME

[75] Inventors: Ryuji Sugita, Hirakata; Toshiaki Kunieda, Minoo, both of Japan

[73] Assignee: Matsushita Electric Industrial Co., Ltd., Kadoma, Japan

[*] Notice: The portion of the term of this patent subsequent to Oct. 16, 2001 has been disclaimed.

[21] Appl. No.: 728,449

[22] Filed: May 1, 1985

Related U.S. Application Data

[62] Division of Ser. No. 497,583, May 24, 1983, abandoned.

[51] Int. Cl.⁴ .................. B05D 5/12; C23C 16/00
[52] U.S. Cl. .................. 427/128; 427/131; 427/132; 427/255.5; 427/255.7; 428/694; 428/900
[58] Field of Search .................. 428/693, 694, 900; 427/131, 132, 255.7, 295, 128, 255.5

[56] References Cited

U.S. PATENT DOCUMENTS

| | | | |
|---|---|---|---|
| 3,520,664 | 7/1970 | York | 427/131 |
| 4,403,002 | 9/1983 | Akashi et al. | 427/255.7 |
| 4,429,016 | 1/1984 | Sugita | 428/694 |
| 4,477,488 | 10/1984 | Sugita et al. | 427/255.7 |

FOREIGN PATENT DOCUMENTS 77025 5/1983 Japan .

OTHER PUBLICATIONS

"Magnetic & Structural Properties of Rh Substituted Co-Ci Alloy films with Perpendicular Magnetic Anisotropy", J. Appl. Phys., 52(3), Mar. 1981, p. 2453-2455.

Kobayashi et al.: "CrCo Vertical Magnetization Aluminum Rigid Disk," presented at 1981's National Conference on Semiconductor Material Sections of Electronic Communication Society.

Kobayashi et al.: "High Density Perpendicular Magnetic Recording on Rigid Disks", Fujitsu, Sci. J., 19, 1, pp. 99-126, Mar. 1983.

Primary Examiner—George F. Lesmes
Assistant Examiner—William M. Atkinson
Attorney, Agent, or Firm—Cushman, Darby & Cushman

[57] ABSTRACT

A vertical magnetization recording medium is formed on a high polymer film substrate by vacuum deposition of Co-Cr film or deposition of Co-Cr film with preceding deposition of permalloy film, both with Ti-vacuum deposited interface film on the substrate face, whereby vertical orientation of the C-axis of Co-Cr film with respect to the film surface is easily obtainable, thereby assuring good characteristic as vertical magnetization recording medium.

3 Claims, 2 Drawing Sheets

MAGNETIC RECORDING MEDIUM AND METHOD FOR MAKING THE SAME

This is a division of application Ser. No. 497,583, filed May 24, 1983 and now abandoned.

BACKGROUND OF THE INVENTION

1. Technical Field

The present invention relates to magnetic recording medium of the vertical magnetization type.

2. Prior Art

As a means of magnetic recording having superior characteristics for very short wavelength recording, vertical magnetization has recently become more and more important. In such a recording method, a recording medium having an axis of easy magnetization which is vertical to the surface of the film medium is required. When a signal is recorded on such a recording medium, remanent magnetization becomes perpendicular to the recording medium surface, accordingly the demagnetization field within the recording medium decreases as the wavelength of the signal becomes shorter, and a superior signal reproduction is obtainable. vertical magnetization recording media hitherto used are manufactured by sputtering a magnetization film having an axis of easy magnetization perpendicular to the film surface directly on, or with a soft magnetic thin film such as permalloy as interface on, a non-magnetic substrate. For the vertical magnetization recording medium, a film mainly consisting of a Co-Cr film of below 30 wt% of Cr has a haxagonal close packed structure and its C-axis can be disposed perpendicularly to the film surface. It is possible to lower the saturation magnetization to such level that the anisotropy magnetic field of the vertical direction exceeds the demagnetization field, and accordingly the vertical magnetization recording medium can be realized.

However, when the sputtering method is used, the speed of forming the magnetization thin film is slow and accordingly it is difficult to produce a vertical magnetization recording medium with a low manufacturing cost. On the contrary, according to a vacuum deposition method (including a method such as an ion-plating method in which a part of evaporated atoms are ionized), the Co-Cr vertical magnetization recording medium can be formed at a high rate of several thousands of Å/sec. Though a vapor deposition of soft magnetic material such as permalloy may be considered, when a magnetic film is formed on a substrate with such material, the vertical magnetization recording medium is not obtainable. In the vapor deposition method, a high productivity is obtainable by utilizing a method of vapor deposition on a substrate running around a cylindrical can.

FIG. 1 shows such vapor deposition system, wherein in an evacuated enclosure 100, a substrate, for instance, high polymer plastic film 1 is driven around a cylindrical can 2 which is kept at a temperature of about 200° C. and rotates around a shaft S, and is fed from a feeding roll 3 to a winding roll 4. A deposition source 6 is heated to a high temperature and the source material is deposited through a slit 7 of a mask 5 onto the running substrate 1.

In order to produce the vertical magnetization recording medium of the Co-Cr deposition film, the C-axis of the hexagonal close packed structure must be disposed vertically to the film surface, and the anisotropic magnetic field in the vertical direction must be larger than the demagnetization field. In other words, the vertical anisotropic constant Ku must be a positive value. In order to fulfill the above-mentioned conditions, it has been experimentally confirmed that residue gas in the vapor deposition should be decreased as small as possible. However, when a high polymer plastic substrate is used, due to an outgassing from the substrate during the vapor deposition, it is difficult to obtain a Co-Cr vertical magnetization recording medium of good characteristics, making the constant Ku a negative value. Though the high polymer substrate can be outgassed by leaving in a high temperature low humidity atmosphere, the substrate part inside the thick roll can not be outgassed. Accordingly, special apparatus becomes necessary in order to produce a vertical magnetization recording medium of Co-Cr with good characteristics by eliminating the adverse influence of the residual gas.

SUMMARY OF THE INVENTION

The present invention purposes to provide a vertical magnetization recording medium having a superior recording characteristic to be produced in the vacuum deposition method, and also to provide an improved method therefore.

A magnetic recording medium in accordance with the present invention comprises:
- a high polymer plastic sheet as the substrate,
- a vacuum deposited Ti-undercoating formed on a surface of the high polymer plastic sheet, and
- a vacuum deposited magnetization film principally containing Co-Cr and having its axis of easy magnetization substantially vertical to the film surface.

DETAILED DESCRIPTION OF THE PREFERRED EMBODIMENTS

Figure 1:
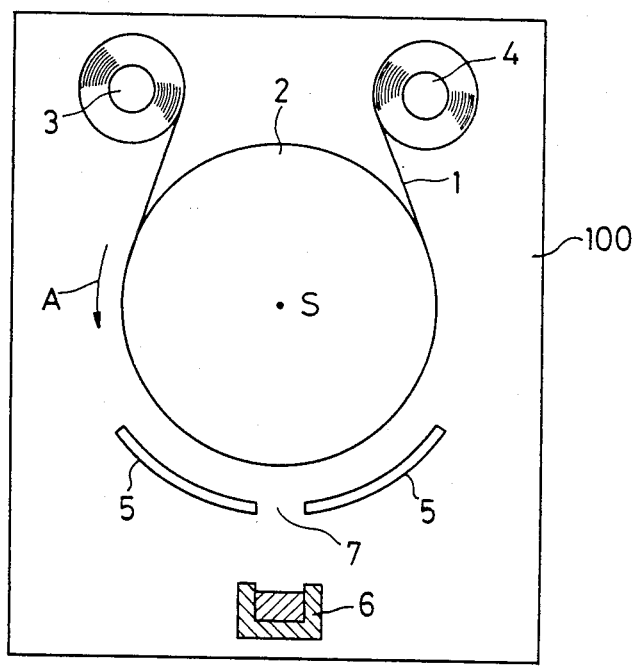
FIG. 1 is a front view of a manufacturing system in accordance with the present invention.

In the manufacturing apparatus shown in FIG. 1, the space in the enclosure 100 is evacuated and the surface temperature of the rotary can 2 is kept at 200° C. The tape substrate 1 of heat-resistant polyamide high polymer plastic material is driven to run around the can face, and a Co-Cr film having a Cr content of 22 wt% is formed by vacuum deposition. The constant Ku of this magnetic film was $-4 \times 10^5$ erg/cc, and no vertical magnetization characteristic was observed.

Figure 2:
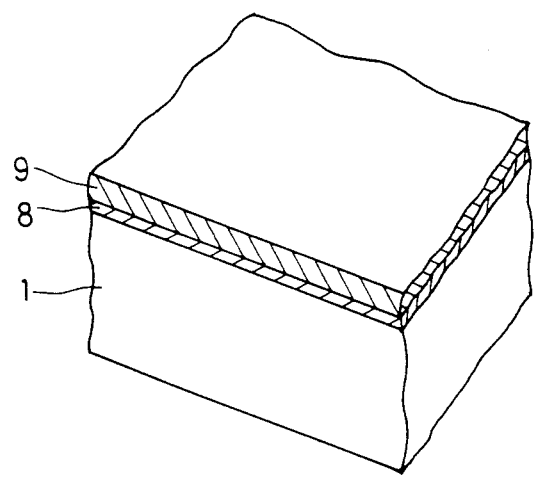
FIG. 2 is a perspective view of a part of a vertical magnetization recording medium in accordance with the present invention.

By using the manufacturing apparatus of FIG. 1 and by means of the vapor deposition method similar to that explained with reference to FIG. 1, a Co-Cr magnetization film 9 is formed, but an undercoating layer 8 is formed by vacuum deposition of Al, Cu, Cr, Si or Ti between the substrate 1 and the Co-Cr film 9 as shown in FIG. 2, then various values of Ku are obtained as shown in the belowmentioned Table 1.

TABLE 1

Ku ($\times 10^5$ erg/cc) for various undercoating layers

| Thickness of undercoating layer (Å) | Undercoating layer | | | | |
|---|---|---|---|---|---|
| | Al | Cu | Cr | Si | Ti |
| 500 | −4 | −4 | −3 | −3 | 3 |
| 1000 | −2 | −2 | −2 | −2 | 3 |
| 1500 | −1 | −1 | 0 | −1 | 3 |

As is obvious from the above-mentioned Table 1, when the material of the undercoating layer is other than Ti, the Ku becomes Ku≦0. When the material of the undercoating layer is Ti, in both cases of their thicknesses being 500 Å and 1500 Å, vertical magnetization films are obtained, and satisfactory values of Ku such as $3 \times 10^5$ erg/cc are obtainable irrespective of the thickness of the Ti-undercoating. Then orientation of the Co-Cr film is examined by means of X-ray analyzer, and it is revealed that, when the undercoating layer is Ti, the C-axis is fairly well disposed vertically to the film surface. But, when the undercoating layers are other than Ti, the C-axis orientation is not good. It is further found that, when the Co-Cr film is vacuum deposited on the undercoating layer of Al, Cu, Cr or Si, outgassing from the substrate occurs during the vacuum deposition. This is measured by means of a vacuum guage. On the contrary, when the Co-Cr film is vacuum deposited on the Ti film, substantially no outgassing from the substrate during the vacuum deposition is observable. Thus, when the Co-Cr vertical magnetization recording medium is formed on the Ti-undercoating formed on the high polymer substrate, it has a superior recording characteristic even when the undercoating layer of Ti is as thin as around 500 Å.

As the reason for the improvement of the orientation by means of providing the Ti-undercoating layer, the following two points may be considered. Firstly, it may be due to epitaxial growth of the Co-Cr film on the Ti-undercoating layer of a hexagonal close packed structure. Secondly, it may be due to very low outgassing during the Co-Cr vacuum deposition on the Ti-undercoating layer and hence low disturbance of the orientation due to the outgassing.

Figure 3:
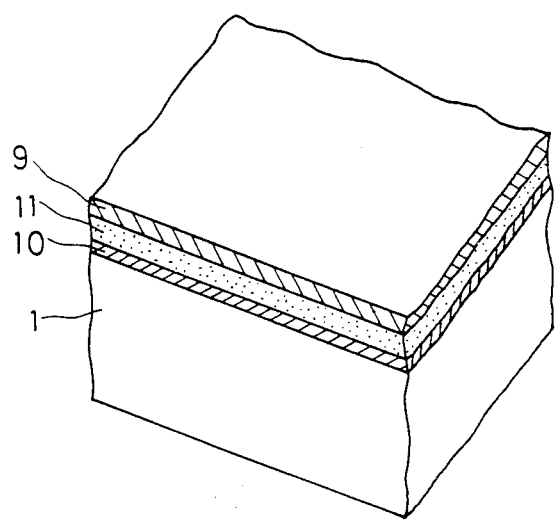
FIG. 3 is a perspective view of a part of another vertical magnetization recording medium in accordance with another embodiment of the present invention.

The above-mentioned experimental study has been specifically directed to a Co-Cr single film, but the present invention is applicable also for a composite vertical magnetization recording medium which is made by forming a Co-Cr film on the lower layer of a soft magnetic thin film, such as permalloy thin film, inbetween. That is, in such a composite magnetic film, when the vacuum depositions of the permalloy thin film and the Co-Cr film are made directly on the high polymer substrate, the constant Ku of Co-Cr film is negative, and the composite film can not work as a vertical magnetization recording medium. But as shown in FIG. 3, by firstly forming a Ti film 10 on the substrate 1 by vacuum deposition, and secondly depositing the permalloy film 11 and thirdly depositing thereon the Co-Cr film 9 by vacuum deposition, a positive constant Ku is obtainable and the magnetic film becomes a vertical magnetization recording medium. In this state also, orientation of C-axis of the Co-Cr film is superior as a result of providing the Ti-undercoating layer 10. The reason may be that: when the permalloy thin film is directly vacuum deposited on the substrate of high polymer material, the orientation is not satisfactory probably due to the outgassing. But by providing vacuum deposited Ti thin film under the permalloy film, the (111) plane face-centered cubic structure of the permalloy film may orient in parallel with the film face probably for the similar reason as in the case of the Co-Cr film formed on the Ti film. And when the Co-Cr film is formed on such an oriented permalloy film, as a result of epitaxy the C-axis orientation of the Co-Cr film may be improved. By the way, it is observed that the Co-Cr film formed on badly oriented permalloy film has a poor C-axis orientation.

In general, when the vacuum deposited film becomes thicker than a certain predetermined thickness, cracking is liable to be produced. The cracking makes unwanted noise when the magnetic film is used as a magnetic recording medium, and the Ti-film is liable to form cracks when the film is thick. Experimental study shows that when the Ti-film is 800 Å or thinner, substantially no crack is produced in the vertical magnetization recording medium. The technical advantage of providing the Ti-undercoating is especially prominent when the substrate film is a polyamide film, polyethylene terephthalate film or polyethylene naphthalate film.

Beside the example of FIG. 1, the mask 5 for controlling the incidence angle of the Co and Cr atoms may be omitted when the Co-Cr film is vacuum deposited on the Ti-undercoating layer directly, or further with permalloy lower layer inbetween, to produce a vertical magnetization recording medium of good orientation.

In all the above-mentioned configurations of the vertical magnetization recording medium, it is necessary to obtain an improved vertical orientation of the Ti-undercoating in the C-axis direction of an hexagonal close packed structure. That is, it is necessary to select the half angle width $\Delta \theta_{50}$ of the rocking curve with respect to the (002) plane of the hexagonal close packed structure to be 20° or smaller.

An actual example of manufacture is given below. In a vacuum deposition apparatus having the configuration shown in FIG. 1, the vertical magnetization recording medium is manufactured as follows: Firstly, on a polyamide film of 10 μm thickness, Ti film of 400 Å is vacuum-deposited. And then, the half angle width $\Delta \theta_{50}$ of the rocking curve with respect to (002) plane of the Ti film was 6.2°. Then on this Ti film, a permalloy film of 1800 Å was vacuum-deposited. The permalloy film was well oriented, so that the half angle width $\Delta \theta'_{50}$ of the rocking curve with respect to (111) plane of the face-centered cubic structure was 7.6°. Then on this permalloy film, a 1000 Å thick Co-Cr film was vacuum-deposited. The half angle width $\Delta \theta''_{50}$ of the rocking curve with respect to the (002) plane of the hexagonal close packed structure of the Co-Cr film was 8.1°, and the Co-Cr film was suitable as a vertical magnetization recording medium. When a signal is recorded on this composite vertical magnetization recording medium, a very much superior short wavelength reproduction output was reproduced. As a comparison sample, a similar composite magnetization recording medium was formed without the Ti-undercoating film, orientations of the permalloy film and of Co-Cr film were undesirable. That is, the half angle width $\Delta \theta'_{50}$ of the rocking curve with respect to the (111) plane of the permalloy film was over 30°. And the half angle width $\Delta \theta''_{50}$ of the rocking curve with respect to the (002) plane of the Co-Cr film was also over 30°, and the composite film was not usable as a vertical magnetization recording medium.

What is claimed is:

1. A method of making a magnetic recording medium comprising the steps of:
    (1) vacuum-depositing Ti on a surface of a high polymer sheet, to form a Ti-undercoating having a thickness no greater than 800 Angstroms, and
    (2) vacuum-depositing a magnetization material consisting essentially of Co-Cr in the form of a layer on the surface of said Ti-undercoating, to form a magnetization film.

2. The method for making a magnetic recording medium according to claim 1, which further comprises intermediate steps (1) and (2), and the additional step of:
    vacuum-depositing a permalloy to form a permalloy intermediate layer between said Ti-undercoating and said magnetization film.

3. The method for making a magnetic recording medium according to claim 1, in which said vacuum deposition steps are applied to a moving surface.